US006886123B1

(12) United States Patent
Chren, Jr.

(10) Patent No.: US 6,886,123 B1
(45) Date of Patent: Apr. 26, 2005

(54) RESIDUE NUMBER SYSTEM ARITHMETIC CIRCUITS WITH BUILT-IN SELF TEST

(75) Inventor: William A. Chren, Jr., Longmont, CO (US)

(73) Assignee: STMicroelectronics, Inc., Carrollton, TX (US)

(*) Notice: Subject to any disclaimer, the term of this patent is extended or adjusted under 35 U.S.C. 154(b) by 499 days.

(21) Appl. No.: 09/656,550

(22) Filed: Sep. 6, 2000

(51) Int. Cl.[7] ............................................. G01R 31/28
(52) U.S. Cl. ..................................... 714/733; 714/700
(58) Field of Search ................................ 714/733, 738, 714/724, 718, 726, 699, 814, 700; 324/765; 375/308; 708/100, 200, 800

(56) References Cited

U.S. PATENT DOCUMENTS

| | | | | |
|---|---|---|---|---|
| 4,433,413 A | * | 2/1984 | Fasang ........................ | 714/732 |
| 4,924,467 A | * | 5/1990 | Criswell ...................... | 714/820 |
| 4,949,249 A | * | 8/1990 | Lefsky et al. ................ | 713/600 |
| 4,996,527 A | * | 2/1991 | Houk et al. .................... | 341/83 |
| 5,081,629 A | * | 1/1992 | Criswell et al. .............. | 714/55 |
| 5,249,144 A | * | 9/1993 | Falk ........................... | 708/191 |
| 5,430,764 A | * | 7/1995 | Chren, Jr. .................... | 375/308 |
| 5,892,632 A | | 4/1999 | Behrens et al. | |
| 5,917,834 A | * | 6/1999 | Arkin .......................... | 714/724 |
| 6,509,728 B1 | * | 1/2003 | Uchino et al. ............ | 324/76.15 |

OTHER PUBLICATIONS

Chren, W.A. Jr., "One–Hot Residue Coding for Low Delay–Power Product CMOS Design", IEEE Transactions on Circuits and Systems II: Analog and Digital Signal Processing, v. 45. No. 3, Mar. 1998, pp. 303–313.

Karim Arabi et al., "Oscillation Built–In Self–Test (OBIST) Scheme for Functional and Structural Testing of Analog and Mixed–Signal Integrated Circuits", Proceedings of the IEEE International Test Conference, Washington, D.C., 1997, pp. 786–795.

N. S. Szabo, et al., Residue Arithmetic and its Applications to Computer Technology, McGraw–Hill, 1967, pp. 147–150.

Chren, W.A. Jr., "A New Residue Number System Division Algorithm", Computers and Mathematics with Applications, vol. 19, No. 7, 1990, pp. 13–29, 1990.

* cited by examiner

*Primary Examiner*—Albert Becady
*Assistant Examiner*—Mujtaba Chaudry
(74) *Attorney, Agent, or Firm*—Stephen Bongini; Lisa K. Jorgenson

(57) ABSTRACT

An arithmetic circuit for use with an RNS is provided. The arithmetic circuit includes an arithmetic core, test circuitry, and logic circuitry. The arithmetic core performs an RNS arithmetic operation, and the test circuitry verifies proper circuit delay by inducing oscillation at the output of the arithmetic core during testing. The logic circuitry produces a pass/fail signal based on whether the oscillation frequency of the arithmetic core is at least equal to a minimum threshold value. In one preferred embodiment, the logic circuitry includes a counter that counts oscillations of the output of the arithmetic core during testing, and a comparator that compares the output of the counter after a predetermined test period with the minimum threshold value. Also provided is a method for testing the propagation delay of an RNS arithmetic circuit having an arithmetic core.

26 Claims, 7 Drawing Sheets

RESIDUE NUMBER SYSTEM ARITHMETIC CIRCUITS WITH BUILT-IN SELF TEST

BACKGROUND OF THE INVENTION

1. Field of the Invention

The present invention relates to electronic circuits, and more specifically to arithmetic circuits having built-in self testing for use with the residue number system.

2. Description of Related Art

Power consumption is now a very important consideration in integrated circuit design. This has compelled circuit designers to consider reducing power consumption through changes in many different levels of the design process, such as the system, technology, algorithm, physical, and circuit levels. For example, system level approaches for reducing power consumption include power supply voltage scaling, clock gating, and subsystem sleep (or power down) modes. Technology level techniques include using dynamic threshold MOSFETs, and algorithm level techniques include using alternate number systems and state encoding. Further, physical level methods include transistor reordering, and circuit level methods include self-timed asynchronous approaches and glitch reduction. The ultra-low power circuits of the future will have to employ several of these approaches because none alone can achieve the power reduction goals for the next decade.

While all of the techniques described above advantageously reduce power consumption, many of them have a deleterious side effect of reducing the speed of the circuit. For example, supply voltage scaling lengthens the system clock period if other factors such as technology and drive strength are kept the same. For this reason, designers now consider the delay-power (DP) product of a circuit as the crucial factor in low power circuit design. One system level design approach that is currently being investigated due to of its potential for significantly reducing the DP product is the One-Hot Residue Number System (OHRNS). For example, the OHRNS is being considered for use in the adaptive FIR (finite impulse response) filters and Viterbi detectors of hard disk drive read channels, in the endecs of wireless telecommunication integrated circuits, and in the adaptive filters of image processing integrated circuits.

The Residue Number System (RNS) is an integer number system in which the basic operations of addition, subtraction, and multiplication can be performed quickly because there are no carries, borrows, or partial products. This allows the basic operations to be performed in a single combinational step, digit-on-digit, using simple arithmetic units operating in parallel. However, other operations such as magnitude comparison, scaling (the RNS equivalent of right shifting), base extension (the RNS equivalent of increasing the bit width), and division are slower and more complicated to implement. Thus, RNS is most widely used in applications in which the basic operations predominate, such as digital signal processing.

The RNS representation of an integer X is a number of digits, with each digit being the residue of X modulo a specially chosen integer modulus. In other words, X is represented as the vector of its residues modulo a fixed set of integer moduli. In order to make the RNS representation of each integer unique for all non-negative values less than the product M of the moduli, the moduli are chosen to be pairwise relatively prime (i.e., the smallest single number into which all divide evenly is equal to the product of the moduli). Letting $m_i$ denote the $i^{th}$ modulus, the RNS representation of X is given by $X \sim (x_1, x_2, \ldots, x_n)$, where $x_i = X$ modulo $m_i$ and is known as the $i^{th}$ residue digit of the RNS representation of X. Table 1 shows the representation of the integers 0 to 2430 in an RNS in which $m_1=11$, $m_2=13$, and $m_3=17$ ("an 11, 13, 17 RNS representation").

TABLE 1

| Integer X | RNS digit $x_{11}$ | RNS digit $x_{13}$ | RNS digit $x_{17}$ |
|---|---|---|---|
| 2430 | 10 | 12 | 16 |
| 2429 | 9 | 11 | 15 |
| ... | | | |
| 19 | 8 | 6 | 2 |
| 18 | 7 | 5 | 1 |
| 17 | 6 | 4 | 0 |
| 16 | 5 | 3 | 16 |
| 15 | 4 | 2 | 15 |
| 14 | 3 | 1 | 14 |
| 13 | 2 | 0 | 13 |
| 12 | 1 | 12 | 12 |
| 11 | 0 | 11 | 11 |
| 10 | 10 | 10 | 10 |
| 9 | 9 | 9 | 9 |
| 8 | 8 | 8 | 8 |
| 7 | 7 | 7 | 7 |
| 6 | 6 | 6 | 6 |
| 5 | 5 | 5 | 5 |
| 4 | 4 | 4 | 4 |
| 3 | 3 | 3 | 3 |
| 2 | 2 | 2 | 2 |
| 1 | 1 | 1 | 1 |
| 0 | 0 | 0 | 0 |

As an example, for the natural number 19, the $x_{11}$ digit is 19 mod(11)=8 (i.e., 19÷13=1 remainder 8), the $X_{13}$ digit is 19 mod(13)=6, and the $X_{17}$ digit is 19 mod(17)=2. Each RNS digit is determined without reference to any other RNS digit, and no RNS representation repeats in the range from 0 to 2430. Negative integers can be represented by limiting the represented range to an equal (or substantially equal) number of positive and negative numbers. The representation of the range from −1215 to 1215 in the 11, 13, 17 RNS representation is shown in Table 2. No separate sign is associated with the RNS representation, and the sign of the represented integer cannot be determined from any less than all of its RNS digits.

TABLE 2

| Integer X | RNS digit $x_{11}$ | RNS digit $x_{13}$ | RNS digit $x_{17}$ |
|---|---|---|---|
| 1215 | 5 | 6 | 8 |
| 1214 | 4 | 5 | 7 |
| 4 | 4 | 4 | 4 |
| 3 | 3 | 3 | 3 |
| 2 | 2 | 2 | 2 |
| 1 | 1 | 1 | 1 |
| 0 | 0 | 0 | 0 |
| −1 | 10 | 12 | 16 |
| −2 | 9 | 11 | 15 |
| −3 | 8 | 10 | 14 |
| −4 | 7 | 9 | 13 |
| −1214 | 7 | 8 | 10 |
| −1215 | 6 | 7 | 9 |

In the RNS, the basic operations of addition, subtraction, and multiplication are performed in digit-parallel fashion, modulo $m_i$. Thus, if operands X and Y have RNS representations of $X \sim (x_1, x_2, \ldots, x_n)$ and $Y \leftrightarrow (y_1, y_2, \ldots, y_n)$, the result Z has an RNS representation of $Z \sim (x_1 \circ y_1, x_2 \circ y_2, \ldots, x_n \circ y_n)$, where "$x_1 \circ y_1$" represents any of the basic operations performed on the two RNS digits modulo $m_1$.

More specifically, the corresponding RNS digits of the two numbers are added, subtracted, or multiplied, and then the proper modulo operation is performed on each to produce the RNS digits of the result.

For example, in the 11, 13, 17 RNS representation of Table 1, 4+15 gives (4, 4, 4)+(4, 2, 15) or (4+4 mod(11), 4+2 mod(13), 4+15 mod(17)), which equals (8, 6, 2) or 19. Similarly, 19–15 gives (8–4 mod(11), 6–2 mod(13), 2–15 mod(17)), which equals (4, 4, 4) or 4. Further, 6×3 gives (6×3 mod(11), 6×3 mod(13), 6×3 mod(17)), which equals (7, 5, 1) or 18. Because all individual operations are performed on each RNS digit independently and without reference to any other RNS digit, the operations can be performed completely in parallel. Thus, each of the basic operations can be performed quickly and efficiently, especially when all of the moduli are relatively small integers.

In electronic circuit implementations, addition is the fundamental RNS operation and subtraction is performed by adding the additive inverse of the subtrahend. Multiplication is also performed using addition by using of the following properties. Any prime modulus p has at least one primitive root, which is an integer α of order p-1 under multiplication. In other words, the primitive root is an integer α whose successive powers, taken modulo p, are the nonzero integers modulo p (i.e., for any $0 \leq X < p$, $X = \alpha^k$ modulo p for some $0 \leq k \leq p-2$). In such a case, X is said to have an index of k, modulo p.

Given the primitive root, multiplication modulo p can be performed by adding the indices modulo p–1. This is analogous to using logarithms in the binary number system. For example, α=2 is a primitive root modulo 13 because, the integers $2^0$, $2^1$, $2^2$, $2^3$, $2^4$, $2^5$, $2^6$, $2^7$, $2^8$, $2^9$, $2^{10}$, and $2^{11}$ modulo 13 are equal to 1, 2, 4, 8, 3, 6, 12, 11, 9, 5, 10 and 7, respectively. Thus, if X=5 ($2^9$ modulo 13) and Y=7 ($2^{11}$ modulo 13), X×Y=35 ($2^8$ modulo 13). Thus, the index of the product modulo p (8) of two RNS digits can be determined by adding the indices of the two RNS digits (9 and 11), modulo p–1 (i.e., (9+11) mod(12)=8).

In electronic circuit implementations, the RNS digits can be encoded in various ways. In conventional binary encoding, each RNS digit is converted to a binary number that is represented by the states of one or more lines, each of which is in one of two states to represent a binary digit of "0" or "1". There is also the "one-hot" encoding scheme in which each possible value of an RNS digit is associated with a separate two-state line. For example, in the 11, 13, 17 RNS representation, 11 lines are used to represent the first RNS digit, 13 lines are used to represent the second RNS digit, and 17 lines are used to represent the third RNS digit. When an RNS digit has a given value, the line associated with that value is high and all of the other lines are low. Thus, only one line of a digit is high (or hot) at any given time.

The use of the one-hot encoding scheme with the RNS produces such compelling advantages in electronic circuit implementations that such a system is identified as the "One-Hot Residue Number System" (OHRNS). While the OHRNS is really the same RNS with the same arithmetic properties, the advantages of using one-hot encoding include basic operation implementation using barrel shifters with their superior delay-power products and operand-independent delays, simple and regular layout of arithmetic circuits, and zero-cost implementation through signal transposition of inverse calculation, index calculation, and residue conversion. When any RNS digit changes in value, at most two lines change state. This is the minimal possible activity factor and yields low power dissipation. Because in OHRNS implementations signal activity factors are near minimal and fewer critical path transistors are present, such systems have very low delay-power products. (A detailed explanation of OHRNS circuits can be found in W. A. Chren, Jr., "One-Hot Residue Coding for Low Delay-Power Product CMOS Design," IEEE Transactions on Circuits and Systems II: Analog and Digital Signal Processing, v. 45, no. 3 (March 1998), pp. 303–313, which is herein incorporated by reference.)

With one-hot encoding of the RNS digits, addition can be performed through a cyclic shift (i.e., rotation). In particular, one of the operands is rotated by an amount equal to the value of the other operand. While such a rotation can be implemented using several different types of circuits, barrel shifters allow all possible rotations of the first operand to be computed in parallel. The second operand determines which of the rotations is output from the barrel shifter as the result. A conventional OHRNS modulo $m_1$ adder is shown in FIG. 1(a). The adder 10 includes a modulo $m_1$ barrel shifter 12 that performs the addition, and a static pipeline register 14 that stores the result for downstream processing. FIG. 1(b) shows the internal structure of the barrel shifter. As shown, NMOS pass transistors 16 are used instead of transmission gates to yield higher speed and lower power dissipation due to smaller input and output capacitive loadings (i.e., because there are half as many NMOS sources/drains per input/output line as when transmission gates are used).

Further, in the OHRNS, subtraction can be performed by adding the additive inverse of the subtrahend, and the additive inverse can be computed by a simple one-to-one mapping using signal transposition. FIG. 2 shows a conventional OHRNS modulo $m_1$ subtractor. As shown, the subtractor 20 is identical to the adder 10 of FIG. 1(a) except for the use of signal transposition 22 on the subtrahend input to the barrel shifter 12. The signal transposition 22 computes the additive inverse quickly and simply through a one-to-one mapping of inputs to outputs.

Multiplication in the OHRNS can also be performed with barrel shifters by using indices. Indices and their additive: inverses, which are known as anti-indices, are the RNS equivalents of logarithms and antilogarithms, as explained above. The computation of indices and anti-indices in any modulus can be performed quickly and simply through a one-to-one mapping. In particular, such mappings in the OHRNS are implemented by merely permutating the signal lines of the RNS digit. In other words, indices and anti-indices can be computed through signal transpositions or wire permutations that require no active circuitry and introduce little or no delay.

FIG. 3 shows a conventional OHRNS modulo $m_1$ multiplier that uses wire transpositions to compute indices and anti-indices. More specifically, the multiplier 30 uses signal transpositions 34, 36, and 38 on the input and output lines to compute the indices and anti-indices, and a barrel shifter 32 to add the indices. A small amount of combinational logic 39 is provided to handle the special case in which at least one of the operands is zero. The separate handling of this special case allows the barrel shifter 32 to perform addition modulo $m_1-1$, rather than modulo $m_1$. As in the adder 10 of FIG. 1(a), a static pipeline register 14 stores the resulting product for downstream processing.

While offering such advantageous characteristics and a very low delay-power product, conventional RNS arithmetic circuits are not testable. In particular, conventional RNS arithmetic circuits do not include simple test circuitry to allow verification of circuit functionality and timing. The input-to-output delay is one of the critical timing values of an RNS arithmetic circuit that must be verified to be within specification. Such timing verification must be provided before RNS arithmetic circuits can be practically used for digital signal processing in actual products such as hard disk drive read channels, wireless telecommunication integrated circuits, and image processing integrated circuits.

SUMMARY OF THE INVENTION

It is an object of the present invention to provide testable arithmetic circuits for use with the Residue Number System (RNS).

Another object of the present invention is to provide RNS arithmetic circuits that have simple circuitry for performing built-in self testing of input-to-output delay.

One embodiment of the present invention provides an arithmetic circuit for use with an RNS. The arithmetic circuit includes an arithmetic core having an output and at least two inputs, test circuitry coupled to the arithmetic core, and logic circuitry coupled to the output of the arithmetic core. The arithmetic core performs an RNS arithmetic operation, and the test circuitry induces oscillation at the output of the arithmetic core during testing. The logic circuitry produces a pass/fail signal based on whether the oscillation frequency of the arithmetic core is at least equal to a minimum threshold value. In a preferred embodiment, the logic circuitry includes a counter that counts oscillations of the output of the arithmetic core during testing, and a comparator that compares the output of the counter after a predetermined test period with the minimum threshold value.

Another embodiment of the present invention provides a method for testing the propagation delay of an RNS arithmetic circuit having an arithmetic core that performs an RNS arithmetic operation. According to the method, the output of the arithmetic core is fed back to one of the inputs of the arithmetic core, and a constant is provided to another input of the arithmetic core so as to induce oscillation at the output of the arithmetic core. A pass/fail signal is produced bred on whether the oscillation frequency of the arithmetic core is at least equal to a minimum threshold value. In one preferred method, the pass/fail signal is produced by counting oscillations of the output of the arithmetic core during a predetermined time period, and comparing the counted oscillations with the minimum threshold value to determine a pass or fail condition.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

The core circuits used to perform OHRNS arithmetic operations have the advantageous property that input-to-output timing is identical for all inputs and outputs. The present invention takes advantage of this property to enable verification of the timing of the circuit with simple built-in self test circuitry. In preferred embodiments, the input-to-output delay of an OHRNS arithmetic circuit is tested using Oscillation Built-In Self Test (OBIST). More specifically, the circuit is made to oscillate by feeding the output back to the input, and the frequency of oscillation of the circuit is measured. Because the frequency of oscillation is inversely proportional to the input-to-output delay of the circuit, the measured frequency can be used to ascertain whether or not the delay of the circuit is within specification. (A general explanation of OBIST can be found in K. Arabi et al., "Oscillation Built-In Self-Test (OBIST) Scheme for Functional and Structural Testing of Analog and Mixed-Signal Integrated Circuits," Proceedings of the IEEE International Test Conference, Washington, D.C. (1997), pp. 786–795, which is herein incorporated by reference.)

Figure 4:
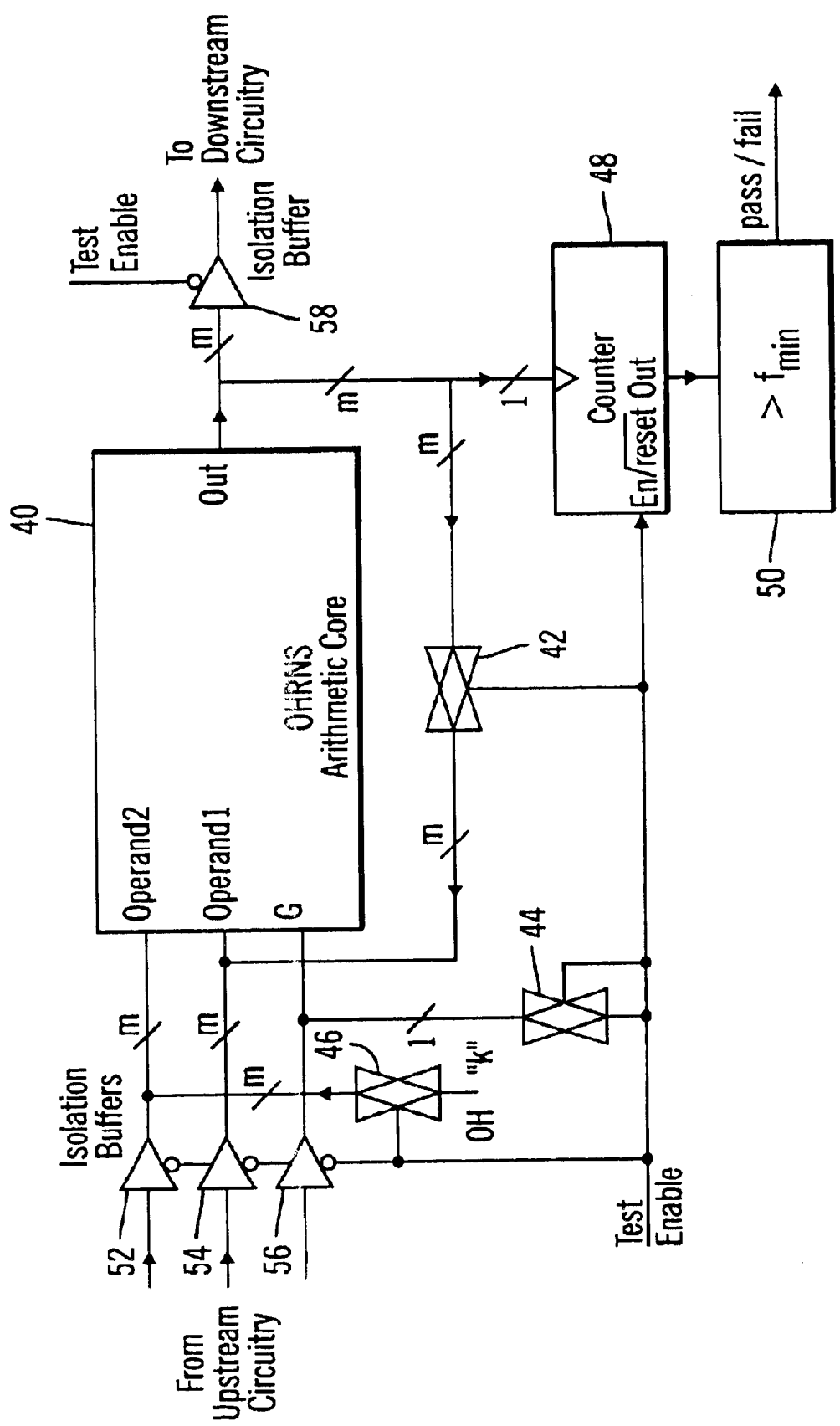
FIG. 4 is a block diagram showing a testable OHRNS arithmetic circuit according to a preferred embodiment of the present invention.

FIG. 4 shows an OHRNS modulo $m_1$ arithmetic circuit with built-in delay self test in accordance with a preferred embodiment of the present invention. As shown, the circuit includes an OHRNS arithmetic core 40, a counter 48, and test logic 50. The arithmetic core 40 is a basic circuit for performing an OHRNS modulo $m_1$ arithmetic operation such as addition, subtraction, multiplication, or scaling. Additionally, the circuit includes transmission gates 42, 44, and 46 that selectively provide feedback, and tristate buffers 52, 54, 56, and 58 that isolate the circuit during testing. The transmission gates can be implemented using either one or two MOS pass transistors and are controlled by a test enable signal. In preferred embodiments, the OHRNS arithmetic circuit of the present invention is incorporated into an integrated circuit device.

The operation of the OHRNS arithmetic circuit of FIG. 4 will now be explained. During normal operation, the test enable signal is held in the inactive state (e.g., low). This causes the transmission gates 42, 44, and 46 to be open and the tristate buffers 52, 54, 56, and 58 to be enabled. Thus, feedback is disabled and the inputs and outputs of the arithmetic core 40 of the circuit are coupled to the other circuitry of the integrated circuit device to provide the desired operation. In this state, the arithmetic core 40 performs its particular OHRNS operation and the result is supplied to the downstream circuitry in the usual manner.

During testing, the test enable signal is changed to the active state (e.g., high). This disables the tristate buffers aid closes the transmission gates to induce oscillation. More specifically, the active test enable signal causes the tristate buffers to go into a high impedance state so as to isolate the inputs and outputs of the arithmetic core 40 from the other circuitry of the integrated circuit device. Additionally, the active test enable signal causes the first transmission gate 42 to feed the m output lines of the arithmetic core 40 back to one of the operand inputs, and the second transmission gate 44 to transfer a one-hot encoded constant k that will cause oscillation of the output to the other operand input of the arithmetic core 40.

For example, if the arithmetic core 40 is a OHRNS adder, the constant k is preferably set equal to 1 so as to form an analog version of a numerically controlled oscillator (NCO) with a phase increment value of 1 and a modulus of $m_1$. Similarly, if the arithmetic core 40 is a OHRNS multiplier, the constant k is set equal to any value other than 0 or 1 so as to form an analog "multiply-accumulate circuit" (MAC) whose output sequence is the nonzero integers modulo $m_1$. Furthermore, if the arithmetic core 40 is the type of circuit that has a gating input G for activating latches that are provided on the output lines, the active test enable signal is supplied to the gating input G through the third transmission gate 44 in order to activate the output latches for the duration of the testing period.

The frequency of oscillation f of the resulting oscillatory signal is measured by coupling one of the output lines of the arithmetic core 40 to the clock input of the counter 48. In the case of an OHRNS adder, the frequency of oscillation f of the NCO (measured at any one of the output lines) depends only on the modulus and the propagation delay $t_d$ between the input and output of the arithmetic core 40 as shown by the following equation.

$$f=1/(m_1 \times t_d)$$

In the case of an OHRNS multiplier, the frequency of oscillation f of the MAC also depends only on the modulus and the propagation delay $t_d$ between the input and output of the arithmetic core 40 as shown by the following equation.

$$f=1/((m_1-1) \times t_d)$$

During testing, the counter 48 is enabled by the active test enable signal and counts the oscillations of the output of the arithmetic core. The output of the counter 48 is supplied to the test logic 50. The number of oscillations during a fixed period of time is directly proportional to the frequency of oscillation f and inversely proportional to the propagation delay $t_d$. Thus, calculation or measurement of test cases can be used to determine the minimum frequency of oscillation $f_{min}$ that corresponds to the highest acceptable propagation delay of the circuit. The test logic 50 compares the selected minimum frequency of oscillation $f_{min}$ with the output of the counter 48 after a predetermined test time T has elapsed.

If the number of oscillations during the test period T (as indicated by the output of the counter) is less than the lower limit threshold given by the minimum frequency of oscillation $f_{min}$, the test logic 50 outputs a fail signal. Conversely, if the output of the counter 48 at least equals the selected threshold value $f_{min}$, the test logic 50 outputs a pass signal. The pass/fail signal output by the test logic of the arithmetic circuit can be directly or indirectly provided to an external device. For example, the pass fail signal can be directly provided to a dedicated pin of the integrated circuit, stored in a register and later scanned out, or supplied to further logic circuitry or a controller that provides a single external pass/fail signal for all of the circuitry of the integrated circuit device. When the test enable signal returns to the inactive state, normal circuit operation is resumed and the counter 48 is reset.

Figure 1A:
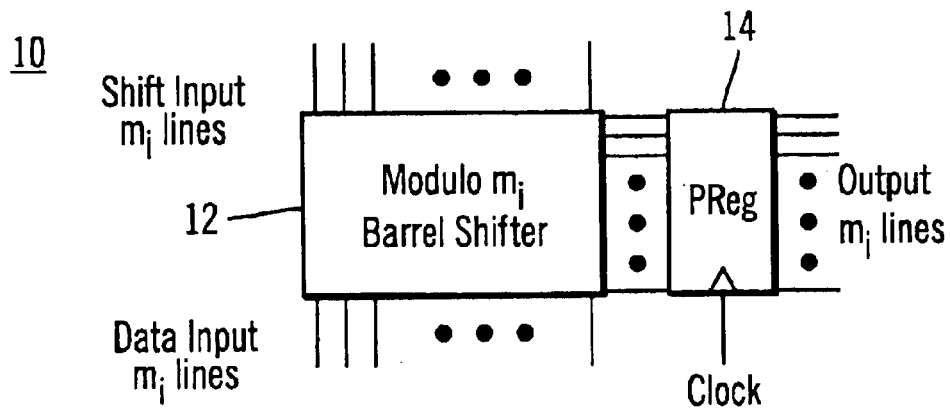
FIG. 1(a) is a diagram showing a conventional OHRNS modulo $m_1$ adder.
Figure 1B:
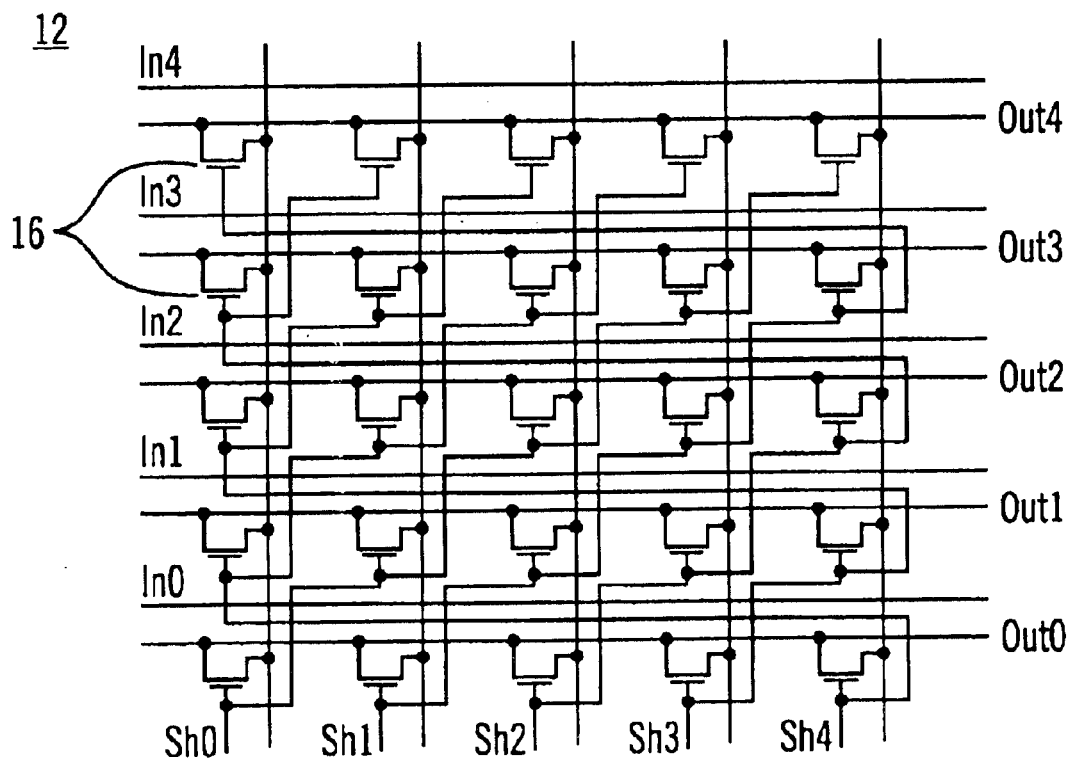
FIG. 1(b) is a circuit diagram showing a barrel shifter for $m_1=5$.
Figure 2:
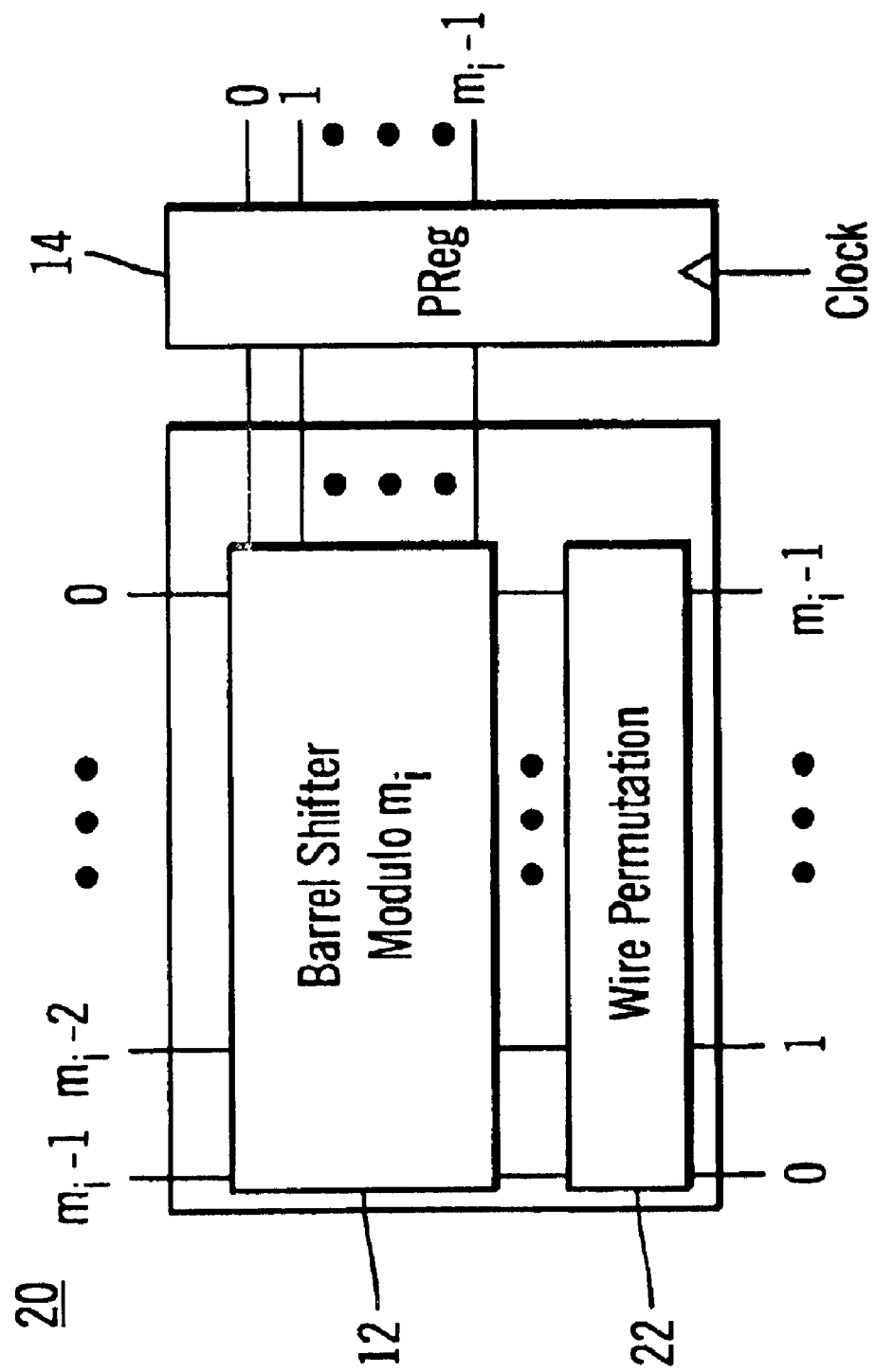
FIG. 2 is a block diagram showing a conventional OHRNS modulo $m_1$ subtractor.
Figure 3:
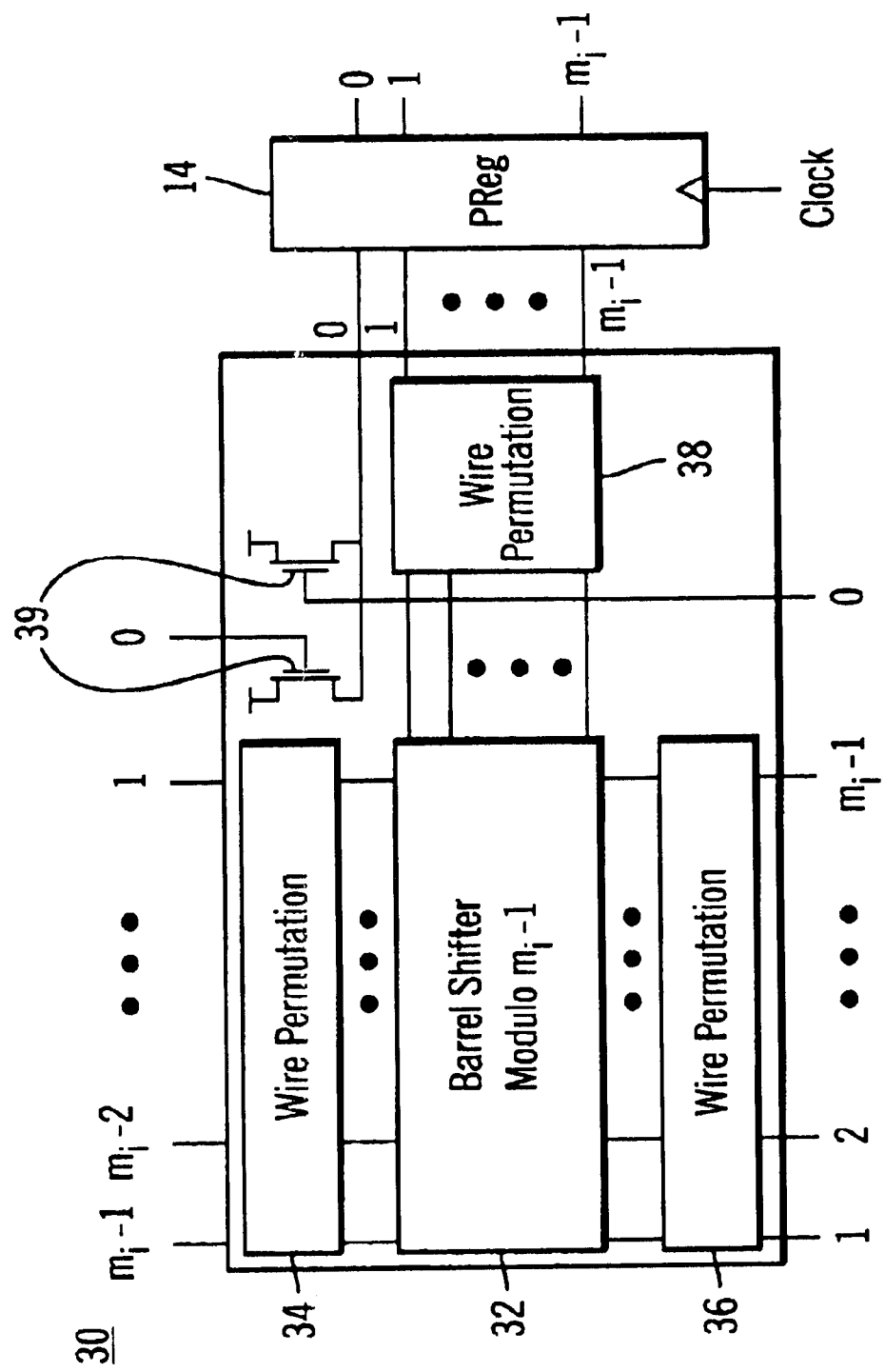
FIG. 3 is a block diagram showing a conventional OHRNS modulo $m_1$ multiplier.
Figure 5:
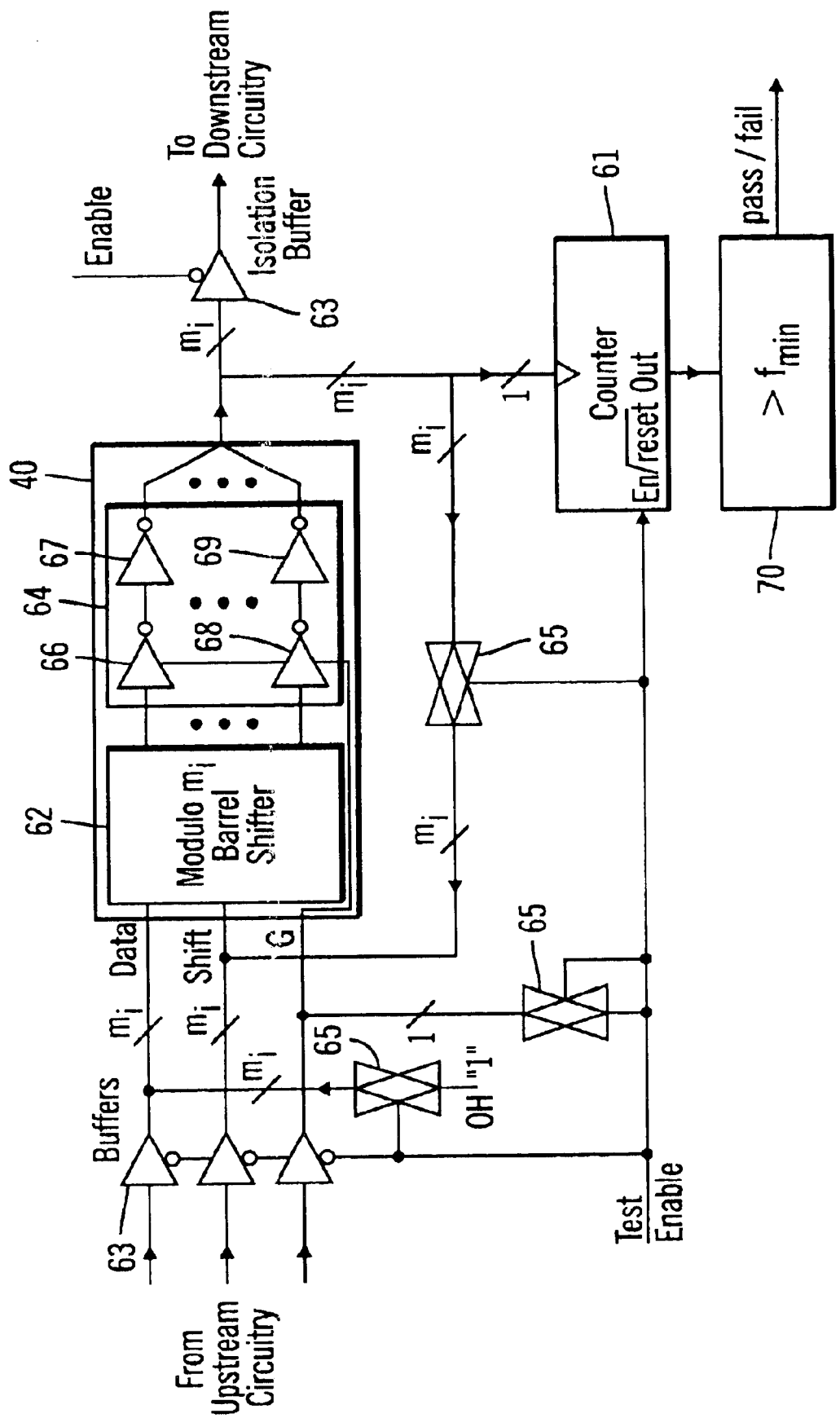
FIG. 5 is a block diagram showing a testable OHRNS modulo $m_1$ adder according to one embodiment of the present invention.

FIG. 5 shows a testable OHRNS modulo $m_1$ adder in accordance with one embodiment of the present invention. In this exemplary embodiment, the adder 60 includes a barrel shifter 62 and a dynamic storage unit 64. The barrel shifter 62 computes the sum of the two operands in the manner described above with reference to FIGS. 1(a) and 1(b). The dynamic storage unit 64 includes two cascaded inverter stages 66 and 67 for each output line of the barrel shifter 62. The cascaded inverter stages 66 and 67 dynamically latch the output of the barrel shifter 62 for downstream circuits by using a clocked inverter 66 as the first inverter in the cascade.

Additionally, isolation buffers 63 are provided on the input and output lines of the adder, and transmission gates 65 are used to induce oscillation. As in the circuit of FIG. 4, a test enable signal is asserted to isolate the inputs and outputs, provide feedback through the transmission gates 65, and to enable a counter 61. During testing, the test enable signal is also provided to the clocked inverters of the dynamic storage unit 64 through a transmission gate. After a predetermined test time T has elapsed, test logic 70 compares the output of the counter with a lower limit threshold and produces a pass/fail signal. When the test enable signal is not asserted, the transmission gates are opened to disable feedback, and the OHRNS adder operates in the normal manner.

Figure 6:
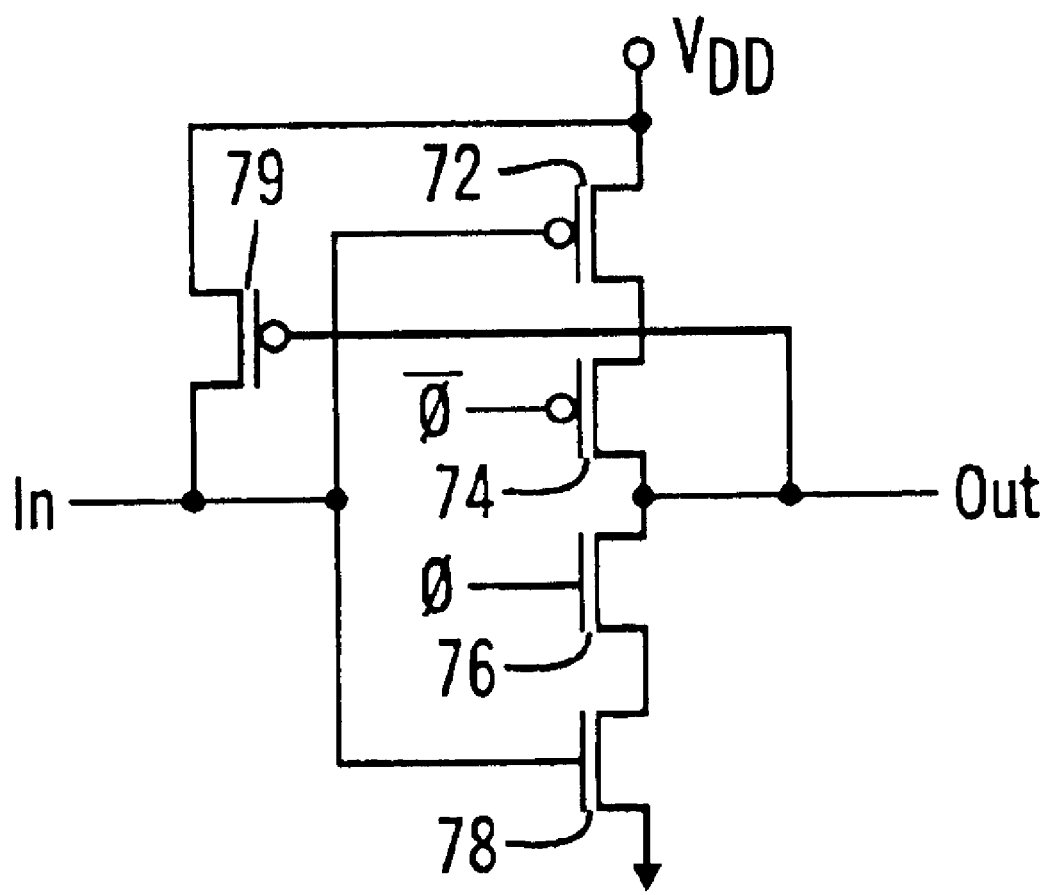
FIG. 6 is a circuit diagram showing an exemplary embodiment for the clocked latch of the OHRNS adder of FIG. 5.

A preferred embodiment for the clocked inverters of FIG. 5 is shown in FIG. 6. The clocked inverter has two PMOS transistors 72 and 74 and two NMOS transistors 76 and 78 arranged in series between the supply voltage Vdd and ground. The gates of the outer PMOS and NMOS transistors 72 and 78 receive the output of the barrel shifter, and the inner PMOS and NMOS transistors 74 and 76 receive a clock signal φ in inverted and non-inverted form, respectively. The connection point of the inner PMOS and NMOS transistors 74 and 76 provides the output OUT of the clocked inverter. When the clock signal φ is high, the clocked inverter operates as a standard CMOS inverter. On the other hand, when the clock signal φ is low, the output of the clocked inverter is tristated so as to cause any charge on the output node of the clocked inverter 66 to be trapped. Therefore, as long as the clock period is relatively short, the output of the second inverter 67 is held substantially steady.

Additionally, in the preferred embodiment, a pull-up transistor 79 controlled by the output OUT is connected between the supply voltage Vdd and the input IN of the latch. When pass transistors are used to implement the barrel shifter 62, high level output signals from the barrel shifter experience voltage degradation (i.e., the output signal does not swing fully to the high rail). Such degraded signal levels cause static power dissipation in downstream circuitry, and thus increase power consumption. However, output level restoration can be used to prevent such leakage power dissipation in the downstream circuitry. The pull-up transistor 79 is used to perform such voltage level restoration at the output of the barrel shifter. In particular, when the input to the clocked inverter goes to the degraded high level that is output by the barrel shifter, the low level output of the inverter turns on the pull-up transistor 79 to couple the input to the supply voltage Vdd (i.e., the desired high level voltage).

Figure 7:
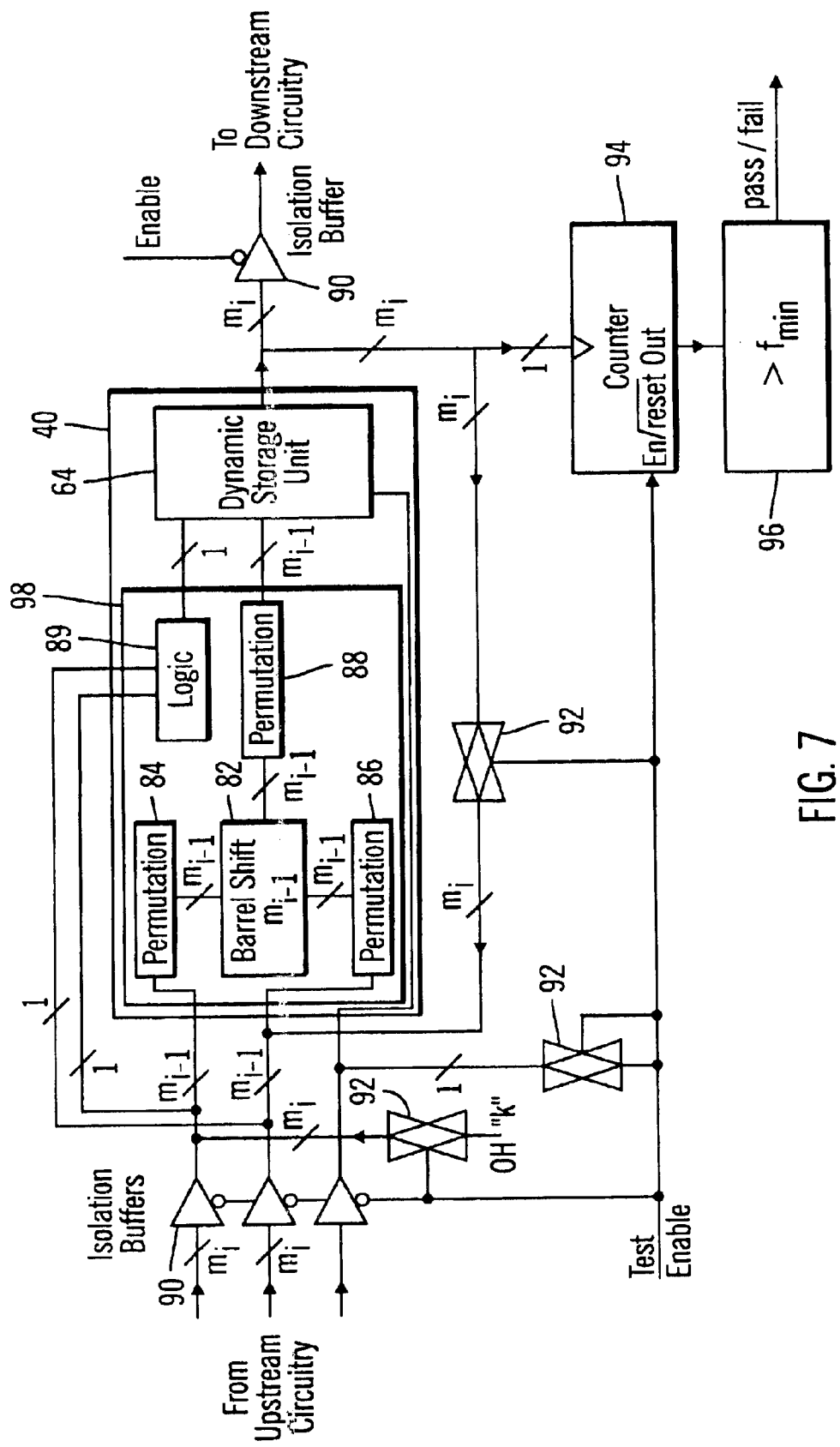
FIG. 7 is a block diagram showing a testable OHRNS modulo $m_1$ multiplier according to another embodiment of the present invention.

FIG. 7 shows a testable OHRNS modulo $m_1$ multiplier according to one embodiment of the present invention. As shown, the multiplier 80 uses signal transpositions 84, 86, and 88 on the input and output lines to compute the indices and anti-indices, and a barrel shifter 82 to add the indices. A small amount of combinational logic 89 is used to handle the special case in which at least one of the operands is zero-valued. The separate handling of this special case allows the barrel shifter 82 to perform addition modulo $m_1-1$, rather than modulo $m_1$. In this exemplary embodiment, a dynamic storage unit 64 stores the resulting product for downstream processing.

Additionally, isolation buffers 90 are provided on the input and output lines, and transmission gates 92 are used to induce oscillation. As in the circuit of FIG. 4, a test enable signal is asserted to isolate the inputs and outputs, provide feedback through the transmission gates 92, and to enable a counter 94. During testing, the test enable signal is also provided to the clock input of the dynamic storage unit 64 through a transmission gate. After a predetermined test time T has elapsed, the test logic 96 compares the output of the counter 94 with a lower limit threshold and produces a pass/fail signal. When the test enable signal is not asserted, the transmission gates are opened to disable feedback, and the OHRNS multiplier operates in the normal manner.

Accordingly, the present invention provides testable arithmetic circuits for use with the Residue Number System. During testing, the arithmetic circuit is isolated from other circuitry and made to oscillate by feeding the output back to the input. The frequency of oscillation of the circuit is measured and used to determine whether or not the propagation delay of the circuit is within specification. Because timing verification is possible, the RNS arithmetic circuits of the present invention can be used in practical digital signal processing devices.

The embodiments of the present invention described above relate to specific CMOS circuit implementations and the use of "one-hot" encoding. However, the arithmetic circuits of the present invention could also be implemented using other integrated circuit technologies and other encoding schemes (e.g., a "one-cold" encoding scheme). Similarly, signal transposition may be achieved in various manners (e.g., through a simple renaming of the lines). Additionally, other design choices, such as the number and values of moduli in the RNS, the physical size and layout of the circuit elements, and the timing of the clock signals could easily be adapted by one of ordinary skill in the art. Furthermore, embodiments of the present invention may not include all of the features described above. For example, pass transistor-based barrel shifters, dynamic latching, and signal level restoration may not be included in all embodiments.

While there has been illustrated and described what are presently considered to be the preferred embodiments of the present invention, it will be understood by those skilled in the art that various other modifications may be made, and equivalents may be substituted, without departing front the true scope of the present invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the

What is claimed is:

1. An arithmetic circuit with built-in self testing of input-to-output delay for use with a Residue Number System (RNS), said arithmetic circuit comprising:

an arithmetic core for performing an RNS arithmetic operation, the arithmetic core having an output and at least two inputs;

input-to-output delay test circuitry coupled to the arithmetic core, the input-to-output delay test circuitry selectively feeding the output of the arithmetic core back to at least one of the inputs without latching so as to induce natural oscillation at the output of the arithmetic core during testing of the input-to-output delay; and input-to-output delay logic circuitry coupled to the output of the arithmetic core, the input-to-output delay logic circuitry measuring an oscillation frequency of the output of the arithmetic core during testing of the input-to-output delay, making a determination of whether the oscillation frequency that is measured is at least equal to a minimum threshold value, and producing a pass signal or a fail signal based on the determination that is made in order to indicate whether or not the input-to-output delay of the arithmetic core is within specification.

2. The arithmetic circuit as defined in claim 1, wherein the input-to-output delay logic circuitry includes:

a counter coupled to the output of the arithmetic core, the counter counting oscillations of the output of the arithmetic core during testing of the input-to-output delay; and a comparator coupled to the counter, the comparator comparing the output of the counter after a predetermined test period with the minimum threshold value and producing the pass or fail signal.

3. The arithmetic circuit as defined in claim 2, wherein the input-to-output delay test circuitry includes:

a plurality of isolation buffers for isolating the inputs of the arithmetic core from upstream circuitry and the output of the arithmetic core from downstream circuitry during testing of the input-to-output delay; and at least one transmission gate for feeding the output of the arithmetic core back to one of the inputs of the arithmetic core without latching during testing of the input-to-output delay.

4. The arithmetic circuit as defined in claim 3, wherein the isolation buffers, the transmission gate, and the counter are controlled by a test enable signal.

5. The arithmetic circuit as defined in claim 1, wherein the input-to-output delay test circuitry includes:

a plurality of isolation buffers for isolating the inputs of the arithmetic core from upstream circuitry and the output of the arithmetic core from downstream circuitry during testing of the input-to-output delay; and at least one transmission gate for feeding the output of the arithmetic core back to one of the inputs of the arithmetic core without latching during testing of the input-to-output delay.

6. The arithmetic circuit as defined in claim 1, wherein the input-to-output delay test circuitry includes:

a plurality of isolation buffers for isolating the inputs of the arithmetic core from upstream circuitry and the output of the arithmetic core from downstream circuitry during testing of the input-to-output delay;

a first transmission gate for feeding the output of the arithmetic core back to one of the inputs of the arithmetic core without latching during testing of the input-to-output delay; and a second transmission gate for supplying a constant to the other input of the arithmetic core during testing of the input-to-output delay.

7. The arithmetic circuit as defined in claim 6, wherein the isolation buffers and the transmission gates are controlled by a test enable signal.

8. The arithmetic circuit as defined in claim 1, wherein the arithmetic core is a One-Hot Residue Number System (OHRNS) modulo m adder.

9. The arithmetic circuit as defined in claim 1, wherein the arithmetic core is a One-Hot Residue Number System (OHRNS) modulo m multiplier.

10. The arithmetic circuit as defined in claim 1, wherein the output of the arithmetic core is not fed back to any of the inputs of the arithmetic core during normal operation of the arithmetic circuit.

11. The arithmetic circuit as defined in claim 1, wherein the output of the arithmetic core is latched during normal operation of the arithmetic circuit.

12. A digital signal processing device having at least one Residue Number System (RNS) arithmetic circuit with built-in self testing of input-to-output delay, said arithmetic circuit comprising:

an arithmetic core for performing an RNS arithmetic operation, the arithmetic core having an output and at least two inputs;

input-to-output delay test circuitry coupled to the arithmetic core, the input-to-output delay test circuitry selectively feeding the output of the arithmetic core back to at least one of the inputs without latching so as to induce natural oscillation at the output of the arithmetic core during testing of the input-to-output delay; and input-to-output delay logic circuitry coupled to the output of the arithmetic core, the input-to-output delay logic circuitry measuring an oscillation frequency of the output of the arithmetic core during testing of the input-to-output delay, making a determination of whether the oscillation frequency that is measured is at least equal to a minimum threshold value, and producing a pass signal or a fail signal based on the determination that is made in order to indicate whether or not the input-to-output delay of the arithmetic core is within specification.

13. The digital signal processing device as defined in claim 12, wherein the input-to-output delay logic circuitry of the arithmetic circuit includes:

a counter coupled to the output of the arithmetic core, the counter counting oscillations of the output of the arithmetic core during testing of the input-to-output delay; and a comparator coupled to the counter, the comparator comparing the output of the counter after a predetermined test period with the minimum threshold value and producing the pass or fail signal.

14. The digital signal processing device as defined in claim 13, wherein the input-to-output delay test circuitry of the arithmetic circuit includes:

a plurality of isolation buffers for isolating the inputs of the arithmetic core from upstream circuitry and the output of the arithmetic core from downstream circuitry during testing of the input-to-output delay; and at least one transmission gate for feeding the output of the arithmetic core back to one of the inputs of the arithmetic core without latching during testing of the input-to-output delay.

15. The digital signal processing device as defined in claim 12, wherein the input-to-output delay test circuitry of the arithmetic circuit includes:

a plurality of isolation buffers for isolating the inputs of the arithmetic core from upstream circuitry and the output of the arithmetic core from downstream circuitry during testing of the input-to-output delay; and at least one transmission gate for feeding the output of the arithmetic core back to one of the inputs of the arithmetic core without latching during testing of the input-to-output delay.

16. The digital signal processing device as defined in claim 12, wherein the input-to-output delay test circuitry of the arithmetic circuit includes:

a plurality of isolation buffers for isolating the inputs of the arithmetic core from upstream circuitry and the output of the arithmetic core from downstream circuitry during testing of the input-to-output delay;

a first transmission gate for feeding the output of the arithmetic core back to one of the inputs of the arithmetic core without latching during testing of the input-to-output delay; and a second transmission gate for supplying a constant to the other input of the arithmetic core during testing of the input-to-output delay.

17. The digital signal processing device as defined in claim 16, wherein the isolation buffers and the transmission gates are controlled by a test enable signal.

18. The digital signal processing device as defined in claim 12, wherein the arithmetic core of the arithmetic circuit is a One-Hot Residue Number System (OHRNS) modulo m adder.

19. The digital signal processing device as defined in claim 12, wherein the arithmetic core of the arithmetic circuit is a One-Hot Residue Number System (OHRNS) modulo m multiplier.

20. A method for testing propagation delay of a Residue Number System (RNS) arithmetic circuit incorporated into an integrated circuit device, the arithmetic circuit including an arithmetic core that performs an RNS arithmetic operation, said method comprising the steps of:

selectively feeding the output of the arithmetic core back to one of the inputs of the arithmetic core without latching and selectively providing a constant to another input of the arithmetic core, so as to induce natural oscillation at the output of the arithmetic core during testing of the propagation delay;

measuring an oscillation frequency of the output of the arithmetic core during testing of the propagation delay;

making a determination of whether the oscillation frequency that is measured is at least equal to a minimum threshold value; and producing a pass signal or a fail signal based on the determination that is made in order to indicate whether or not the propagation delay of the arithmetic core is within specification.

21. The method as defined in claim 20,
wherein the measuring step includes the sub-step of counting oscillations of the output of the arithmetic core during a predetermined time period, and
the making step includes the sub-step of comparing the counted oscillations with the minimum threshold value to make the determination.

22. The method as defined in claim 21, further comprising the step of isolating the inputs of the arithmetic core from upstream circuitry and the output of the arithmetic core from downstream circuitry during testing of the propagation delay.

23. The method as defined in claim 20, further comprising the step of isolating the inputs of the arithmetic core from upstream circuitry and the output of the arithmetic core from downstream circuitry during testing of the propagation delay.

24. The method as defined in claim 23, further comprising the step of supplying a test enable signal to start testing of the propagation delay.

25. The method as defined in claim 20, wherein the arithmetic core is a One-Hot Residue Number System (OHRNS) modulo m adder.

26. The method as defined in claim 20, wherein the arithmetic core of the arithmetic circuit is a One-Hot Residue Number System (OHRNS) modulo m multiplier.

* * * * *